US008809925B2

(12) United States Patent
Chen et al.

(10) Patent No.: US 8,809,925 B2
(45) Date of Patent: Aug. 19, 2014

(54) PARTIAL BURIED CHANNEL TRANSFER DEVICE IN IMAGE SENSORS

(71) Applicant: OmniVision Technologies, Inc., Santa Clara, CA (US)

(72) Inventors: Gang Chen, San Jose, CA (US); Hsin-Chih Tai, San Jose, CA (US); Duli Mao, Sunnyvale, CA (US); Zhenhong Fu, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 48 days.

(21) Appl. No.: 13/649,842

(22) Filed: Oct. 11, 2012

(65) Prior Publication Data

US 2014/0103410 A1   Apr. 17, 2014

(51) Int. Cl.
*H01L 31/062*   (2012.01)
*H01L 31/113*   (2006.01)

(52) U.S. Cl.
USPC .................. 257/292; 257/243; 257/E31.054; 257/E27.162; 257/E27.133; 257/E31.001; 438/57; 438/60

(58) Field of Classification Search
USPC .............. 438/57, 60; 257/243, 292, E31.054, 257/E27.162, E27.133, E31.001
See application file for complete search history.

(56) References Cited

U.S. PATENT DOCUMENTS

| 7,410,823 | B2 * | 8/2008 | Shin ................................ 438/60 |
| 7,517,714 | B2 * | 4/2009 | Park et al. ........................ 438/57 |
| 7,791,113 | B2 * | 9/2010 | Hynecek et al. ............... 257/239 |
| 2008/0179639 | A1 * | 7/2008 | Gambino et al. ............. 257/291 |
| 2008/0296630 | A1 | 12/2008 | Hynecek et al. |
| 2010/0314667 | A1 | 12/2010 | Nozaki et al. |
| 2011/0032405 | A1 | 2/2011 | Nozaki et al. |
| 2013/0092982 | A1 * | 4/2013 | Chen et al. ..................... 257/223 |

\* cited by examiner

*Primary Examiner* — Matthew W Such
*Assistant Examiner* — Samuel Lair
(74) *Attorney, Agent, or Firm* — Blakely Sokoloff Taylor & Zafman LLP

(57) ABSTRACT

An image sensor pixel includes a photosensitive element, a floating diffusion ("FD") region, and a transfer device. The photosensitive element is disposed in a substrate layer for accumulating an image charge in response to light. The FD region is disposed in the substrate layer to receive the image charge from the photosensitive element. The transfer device is disposed between the photosensitive element and the FD region to selectively transfer the image charge from the photosensitive element to the FD region. The transfer device includes a gate, a buried channel dopant region and a surface channel region. The gate is disposed between the photosensitive element and the FD region. The buried channel dopant region is disposed adjacent to the FD region and underneath the gate. The surface channel region is disposed between the buried channel dopant region and the photosensitive element and disposed underneath the gate.

18 Claims, 7 Drawing Sheets

PARTIAL BURIED CHANNEL TRANSFER DEVICE IN IMAGE SENSORS

TECHNICAL FIELD

This disclosure relates generally to optics, and in particular but not exclusively, relates to image sensors.

BACKGROUND INFORMATION

Image sensors are widely used in digital still cameras, cellular phones, security cameras, as well as in, medical, automobile, and other applications. Complementary metal-oxide-semiconductor ("CMOS") technology is used to manufacture lower cost image sensors on silicon substrates. In a large number of image sensors, the image sensor commonly includes hundreds, thousand or even millions of light sensor cells or pixels. A typical individual pixel includes a micro-lens, a filter, a photosensitive element, a floating diffusion region, and one or more transistors for reading out a signal from the photosensitive element. One of the transistors included in the typical pixel is commonly referred to as a transfer transistor, which includes a transfer gate disposed between the photosensitive element and the floating diffusion. The transfer gate is disposed on a gate oxide. The photosensitive element, floating diffusion region, and gate oxide are disposed on a substrate.

During operation of a typical pixel, a conducting channel region may be formed under the transfer gate when a bias voltage is applied to the transfer gate such that an image charge is transferred from the photosensitive element to the floating diffusion region. However, conventional pixels often suffer from image lag, blooming, and manufacturing challenges.

Image lag may result from the conventional transfer transistor being unable to remove all the signal from the photosensitive element such that a residual signal remains during successive readings of the pixel. This leftover information remaining in the photosensitive element is often referred to as image lag, residual image, ghosting or frame-to-frame retention.

Blooming may result from high intensity portions of an image which cause photo-generated excess charge carriers to spill into adjacent photosensitive elements. In one design of a transfer transistor, an N-doped polysilicon gate electrode controls a surface channel transistor as in a standard NMOS transistor. In this design, the transistor's threshold voltage is low and a negative gate bias generally needs to be applied during an integration period and a large gate voltage swing is required to minimize image lag. In this case, blooming may result and blooming may limit the imaging sensor's dynamic range and may limit the types of commercial applications of the imaging sensor.

Manufacturing challenges in the conventional pixel may stem from the position-sensitive placement of the photosensitive element in relation to the transfer gate. The sensitive nature of the placement may result in increased defects in parts and increased manufacturing costs.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of an apparatus, system, and method of manufacture for an image sensor with a partial buried channel transfer gate are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
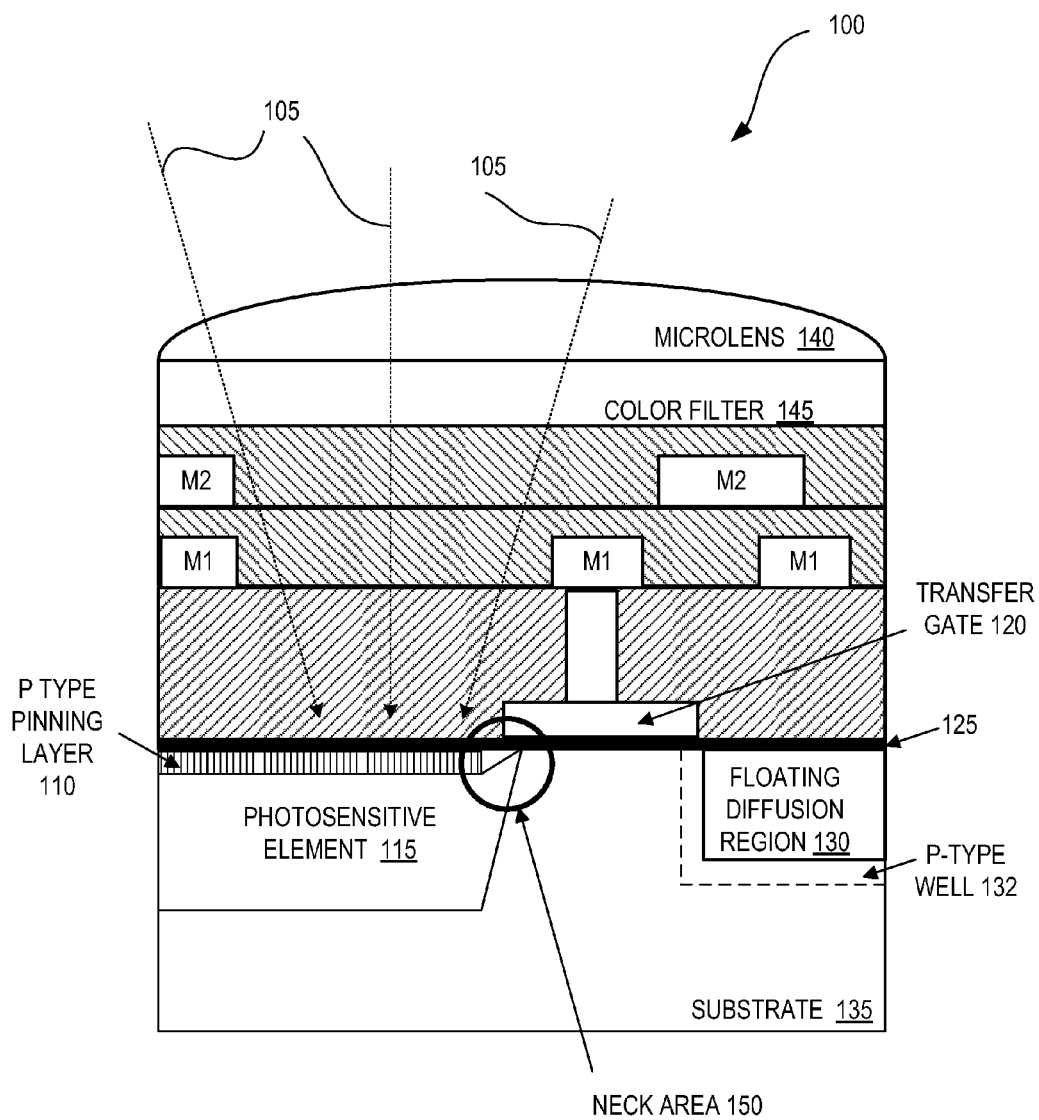
FIG. 1 is a cross sectional view of a conventional image sensor pixel including a conventional transfer gate structure and a conventional photosensitive element structure.

FIG. 1 is a cross sectional view of a conventional image sensor pixel including a conventional transfer gate structure and a conventional photosensitive element structure. An image pixel 100 includes a photosensitive element 115 that receives light 105 that is incident on image pixel 100. To implement a color pixel, image pixel 100 further includes a color filter 145 disposed under a microlens 140. Microlens 140 aids in focusing light 105 onto photosensitive element 115. Generally, an image sensor includes many image pixels 100 arranged in an array of two dimensional rows and columns in a larger substrate (i.e., extending beyond substrate 135 as shown). Image pixel 100 further includes a floating diffusion ("FD") region 130 and photosensitive element 115 (e.g. photodiode) disposed on substrate 135. Substrate 135 may include an epitaxial layer grown on a substrate. Transfer gate 120 is disposed between photosensitive element 115 and FD region 130 and is used to transfer the signal output from photosensitive element 115 to FD region 130. FD region 130 is surround by P type well 132, which is formed in substrate 135. A conducting channel (not illustrated) may be formed in substrate 135 under transfer gate 120 and under gate insulating layer 125 when a threshold gate voltage (i.e. bias voltage)

is applied to it. A P type pinning layer 110 may be disposed over photosensitive element 115. Neck area 150 is a region that includes the intersection of P type pinning layer 110, photosensitive element 115, transfer gate 120, and substrate 135.

Pixel 100 operates as follows. During an integration period (also referred to as an exposure or accumulation period), light 105 is incident on photosensitive element 115. Photosensitive element 115 generates an electrical signal (photo-generated charge) in response to the incident light. The electrical signal is held in photosensitive element 115. At this stage, transfer gate 120 may be off. When the bias voltage on transfer gate 120 does not reach its threshold voltage, transfer gate 120 is off and the substrate between photosensitive element 115 and FD region 130 is resistant to electron flow.

After the integration period, transfer gate 120 is turned on to read out the signal from photosensitive element 115. For example, a positive bias voltage is applied to transfer gate 120 and when the bias voltage on transfer gate 120 is increased, the substrate below transfer gate 120 near floating diffusion region 130 first becomes conductive. The substrate below transfer gate 120 that becomes conductive when a bias voltage is applied to transfer gate 120 is called the channel region (not illustrated). The channel region continues to gradually become conductive toward photosensitive element 115 as the threshold voltage is approached. When the threshold voltage is met, the channel region is conductive allowing charge carriers to flow between photosensitive element 115 and FD region 130, thus transferring the electrical signal held by photosensitive element 115 to FD region 130. After the electrical signal in photosensitive element 115 has been transferred to floating diffusion region 130, transfer gate 120 is turned off in anticipation of the next integration period.

Figure 2:
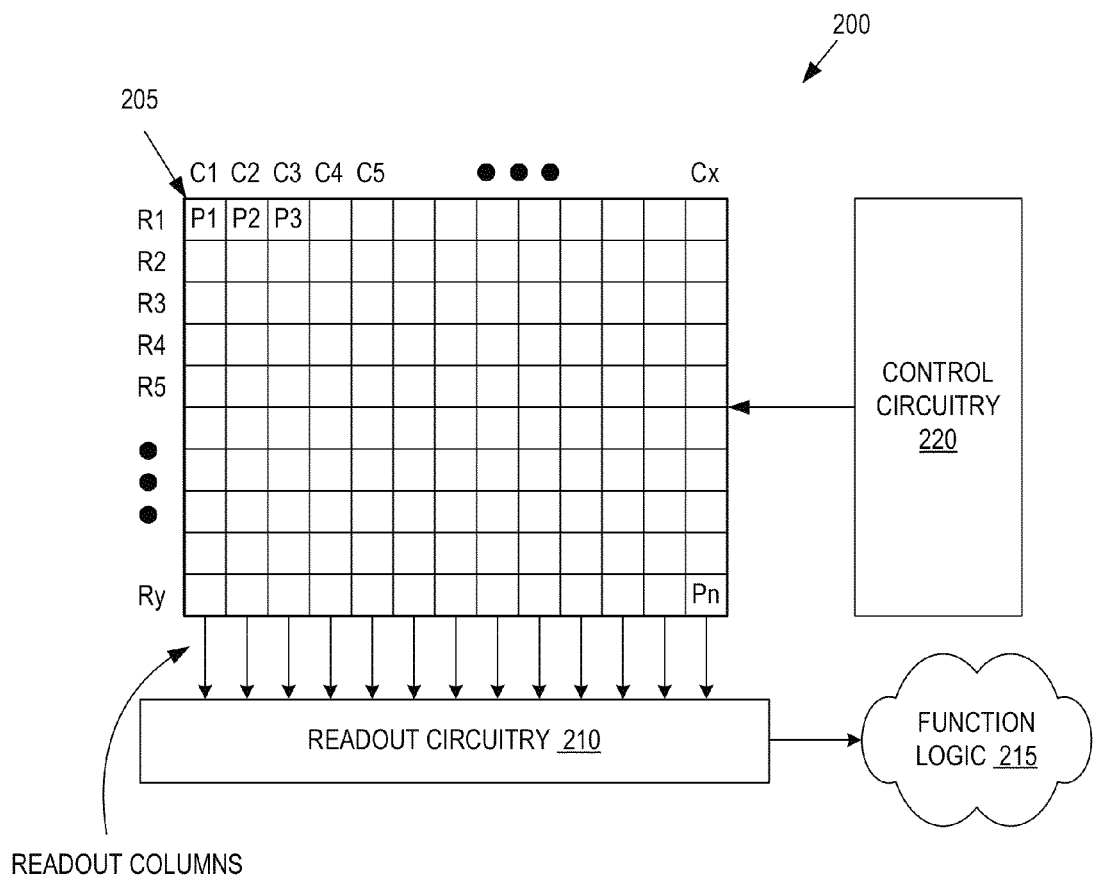
FIG. 2 is a functional block diagram illustrating an image sensor, in accordance with an embodiment of the disclosure.

FIG. 2 is a block diagram illustrating an imaging system 200, in accordance with an embodiment of the disclosure. The illustrated embodiment of imaging system 200 includes a pixel array 205, readout circuitry 210, function logic 215, and control circuitry 220.

Pixel array 205 is a two-dimensional ("2D") array of imaging sensors or pixels (e.g., pixels P1, P2 . . . , Pn). In one embodiment, each pixel is a complementary metal-oxide-semiconductor ("CMOS") imaging pixel. As illustrated, each pixel is arranged into a row (e.g., rows R1 to Ry) and a column (e.g., column C1 to Cx) to acquire image data of a person, place, or object, which can then be used to render a 2D image of the person, place, or object.

After each pixel has acquired its image data or image charge, the image data is readout by readout circuitry 210 and transferred to function logic 215. Readout circuitry 210 may include amplification circuitry, analog-to-digital ("ADC") conversion circuitry, or otherwise. Function logic 215 may simply store the image data or even manipulate the image data by applying post image effects (e.g., crop, rotate, remove red eye, adjust brightness, adjust contrast, or otherwise). In one embodiment, readout circuitry 210 may readout a row of image data at a time along readout column lines (illustrated) or may readout the image data using a variety of other techniques (not illustrated), such as a serial readout or a full parallel readout of all pixels simultaneously. Control circuitry 220 is coupled to pixel array 205 to control operational characteristic of pixel array 205. For example, control circuitry 220 may generate a shutter signal for controlling image acquisition.

Figure 3:
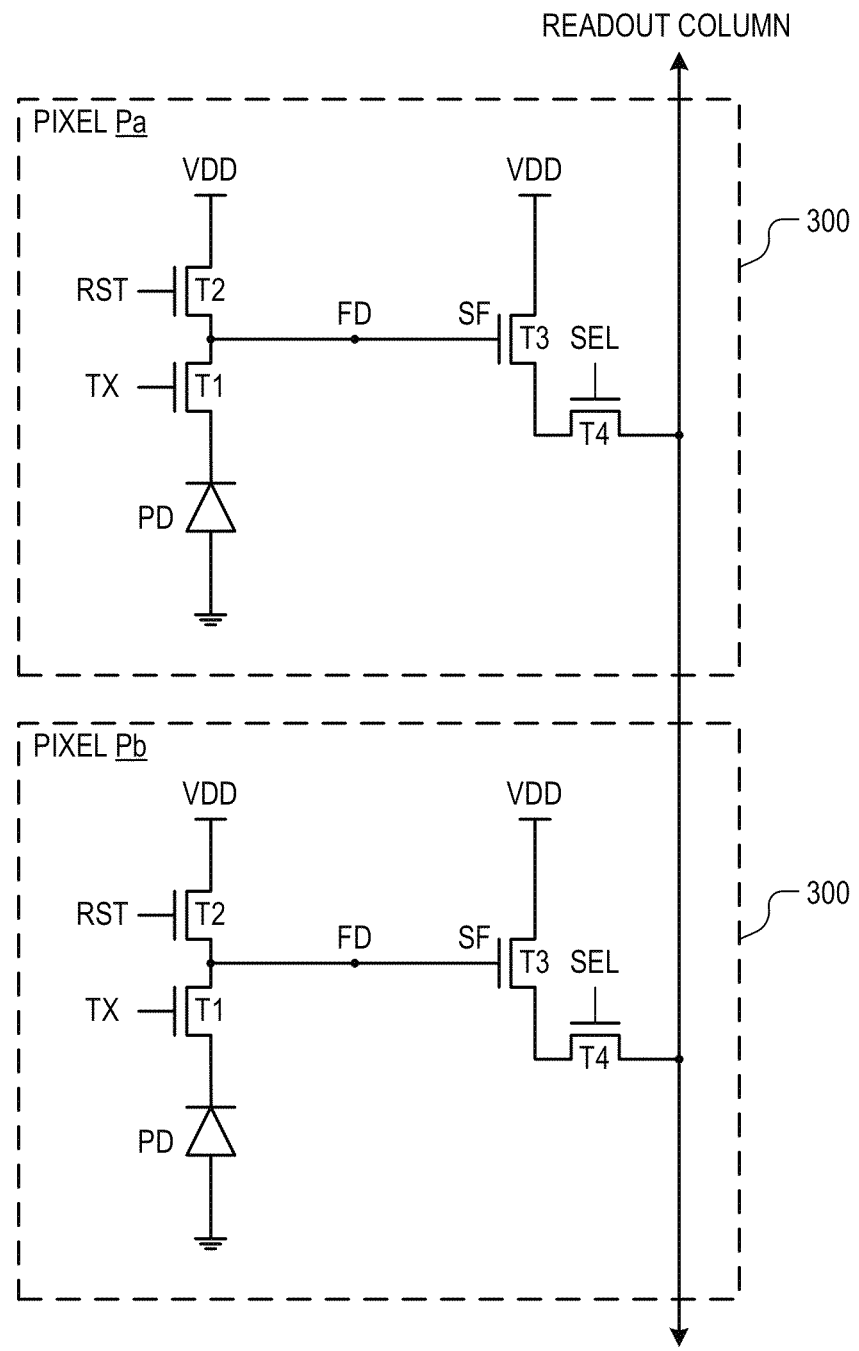
FIG. 3 is a circuit diagram illustrating sample pixel circuitry of two image sensor pixels within an image sensor, in accordance with an embodiment of the disclosure.

FIG. 3 is a circuit diagram illustrating pixel circuitry 300 of two four-transistor ("4T") pixels within an imaging array, in accordance with an embodiment of the invention. Pixel circuitry 300 is one possible pixel circuitry architecture for implementing each pixel within pixel array 205 of FIG. 2. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures.

In FIG. 3, pixels Pa and Pb are arranged in two rows and one column. The illustrated embodiment of each pixel circuitry 300 includes a photodiode PD, a transfer transistor T1, a reset transistor T2, a source-follower ("SF") transistor T3, a select transistor T4, and a storage capacitor C1. During operation, transfer transistor T1 receives a transfer signal TX, which transfers the charge accumulated in photodiode PD to a floating diffusion node FD. In one embodiment, floating diffusion node FD may be coupled to a storage capacitor for temporarily storing image charges.

Reset transistor T2 is coupled between a power rail VDD and the floating diffusion node FD to reset the pixel (e.g., discharge or charge the FD and the PD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance connection to the floating diffusion FD. Finally, select transistor T4 selectively couples the output of pixel circuitry 300 to the readout column line under control of a select signal SEL. In one embodiment, the TX signal, the RST signal, and the SEL signal are generated by control circuitry 220.

Figure 4A:
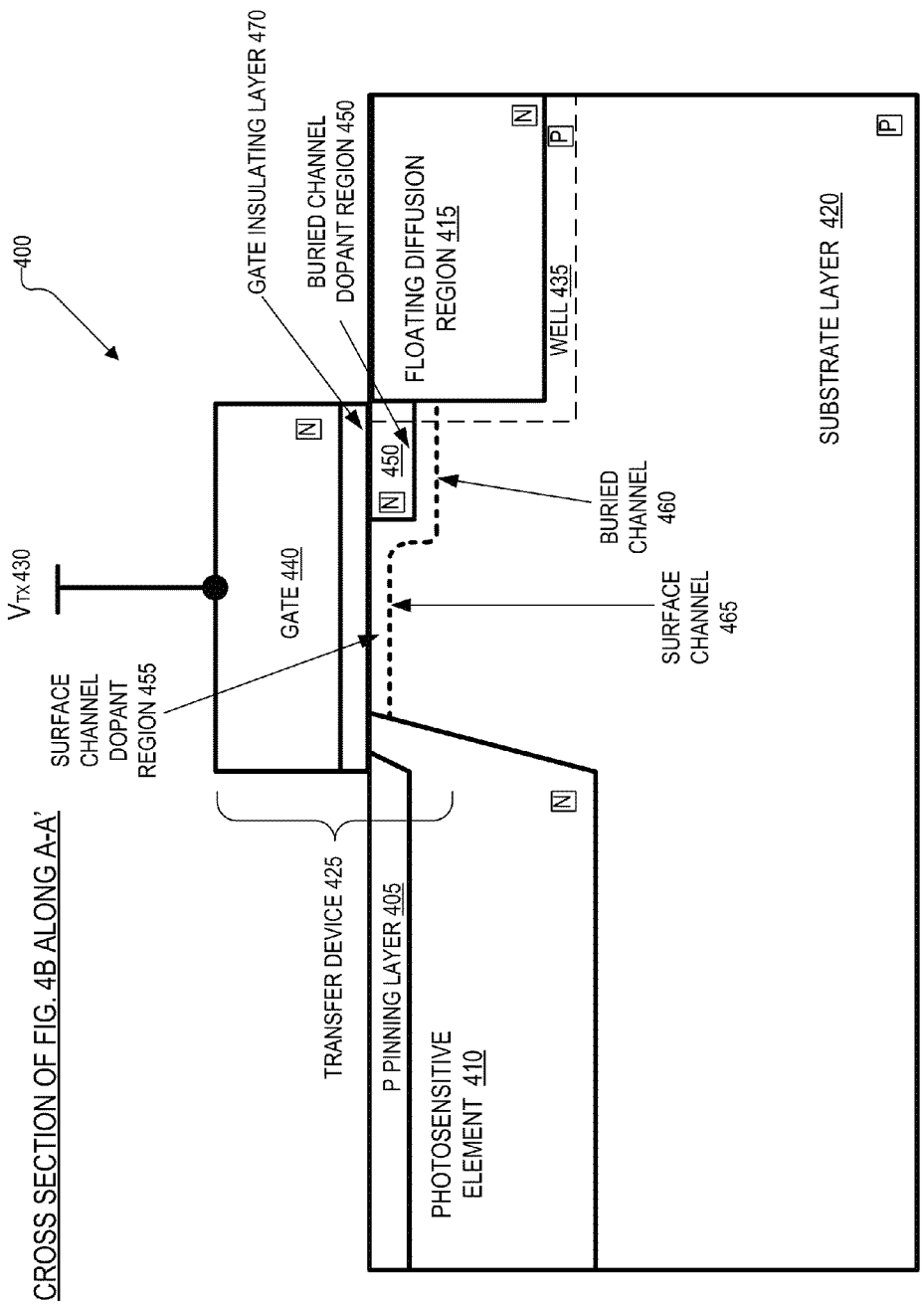
FIG. 4A is a cross sectional view along the A-A' line of FIG. 4B illustrating a portion of an image sensor pixel including a transfer device, in accordance with an embodiment of the disclosure.
Figure 4B:
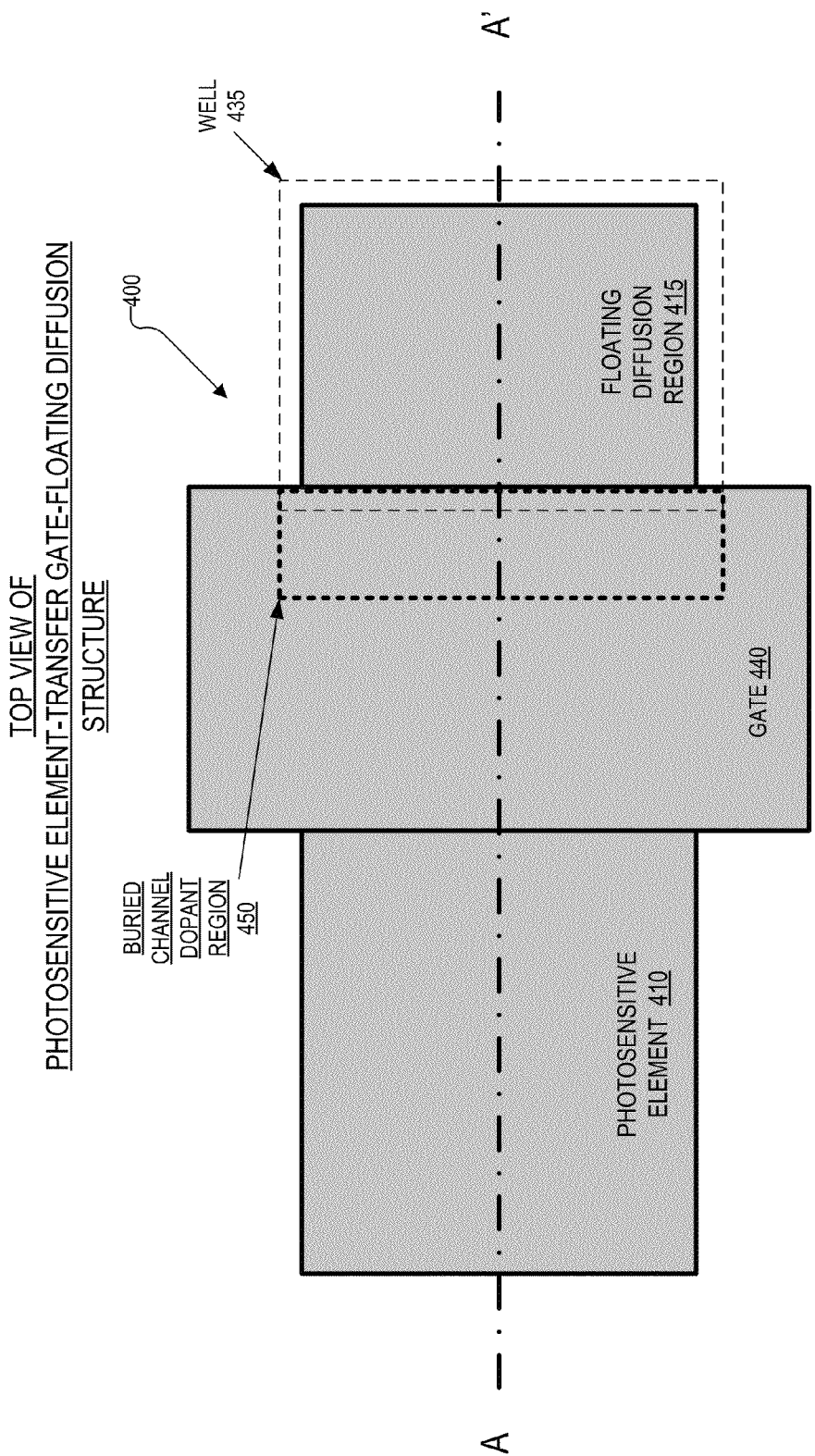
FIG. 4B is a top view of the structures of a photosensitive element, a transfer gate, and a floating diffusion region, in accordance with an embodiment of the disclosure.

FIG. 4A and FIG. 4B illustrate a portion of image pixel 400 including a transfer device 425, in accordance with an embodiment of the disclosure. FIG. 4B is a top view of image pixel 400 and FIG. 4A is a cross sectional view along the A-A' line of FIG. 4B. Image pixel 400 of FIG. 4A is one possible implementation of pixels P1 to Pn within pixel array 205. The illustrated embodiment of image pixel 400 includes a P pinning layer 405, a photosensitive element 410, a floating diffusion region 415, a doped well 435, a substrate layer 420, and transfer device 425. Photosensitive element 410, doped well 435, and floating diffusion region 415 are disposed within substrate layer 420. P pinning layer 405 is disposed above photosensitive element 410. Transfer device 425 is disposed between photosensitive element 410 and floating diffusion region 415.

The illustrated embodiment of transfer device 425 includes a common gate electrode 440, a buried channel dopant region 450, a surface channel dopant region 455, and a gate insulating layer 470. A $V_{TX}$ 430 may be applied to common gate electrode 440 for activating transfer device 425. In the illustrated embodiment, gate electrode 440 is disposed above buried channel dopant region 450 (forming a buried channel device) in addition to being disposed above surface channel dopant region 455 (forming a surface channel device). The buried channel device and the surface channel device are coupled in series between photosensitive element 410 and floating diffusion region 415. Buried channel dopant region 450 may be aligned under common gate electrode 440 and the right edge of buried channel dopant region 450 may be flush with the right edge of common gate electrode 440. Surface channel dopant region 455 may be under common gate electrode 440 and the left edge of surface channel region 455 may adjoin the right edge of photosensitive element 410.

$V_{TX}$ 430 may reach a threshold voltage of transfer device 425, turning transfer device 425 on. When transfer device 425 is turned on, buried channel 460 and a surface channel 465 form in series, allowing charge carriers to flow between photosensitive element 410 and floating diffusion region 415. Buried channel 460 and surface channel 465 collectively make up the channel of transfer device 425. In one embodiment, transfer device 425 may be configured to receive a $V_{TX}$ 430 of −1.2 Volts to keep transfer device 425 turned off.

In the illustrated embodiment, photosensitive element 410 and floating diffusion region 415 are N type doped, while the well 435 is doped inversely (P type) from the N type dopant of photosensitive element 410 and floating diffusion region 415. Buried channel dopant region 450 is doped N type. In the illustrated embodiment, surface channel dopant region 455 is P type doped. In alternative embodiments, surface channel region 455 may be doped N type or not be doped at all. One of ordinary skill in the art will understand that the doping polarities in the illustrated embodiment may be reversed in alternative embodiments.

In the illustrated embodiment, buried channel dopant region 450 and photosensitive element 410 are both N type doped, while surface channel dopant region 455 is P type doped making for more controlled transfer of electrons from the photodiode because there is a slight energy barrier for transferring the electrons. Buried channel dopant region 450 may mean transfer device 425 is referenced as a partial buried channel transfer gate. The length of the surface channel dopant region 455 is limited by the presence of the buried channel dopant region 450 and causes a reduction in barrier effectiveness. During the exposure period (transfer device 425 is off), the electrical charge accumulated by N type doped photosensitive element 410 may be retained within photosensitive element 410 unless it is nearly full or approaching full capacity. In one example, electrons entering surface channel dopant region 455 may "punch through" to buried channel dopant region 450 and to floating diffusion region 415. This feature of the illustrated embodiment encourages charge carriers from photosensitive element 410 to spill into floating diffusion region 415 rather than flowing to a photosensitive element of a neighboring pixel, causing blooming. By adjusting the ratio between the length of buried channel dopant region 450 and surface channel region 455, the blooming threshold can be tuned. For example, when surface channel region 455 is shortened, the barrier for excess charge to spill into floating diffusion region 415 is reduced, thereby further inhibiting blooming.

In the illustrated embodiment, buried channel dopant region 450 is doped opposite of the substrate. Consequently, when transfer device 425 is turned on, charge carriers are pushed below the surface (meaning below the intersection of gate insulating layer 470 and buried channel dopant region 450). Buried channel 460 illustrates charge carriers flowing beneath the surface. Charge carriers flowing beneath the surface may introduce less noise into an electrical signal because non-uniformities between the gate insulating layer (e.g. silicon-oxide) and the buried channel dopant region (e.g. N type doped silicon) are not encountered by the charge carriers.

Figure 5:
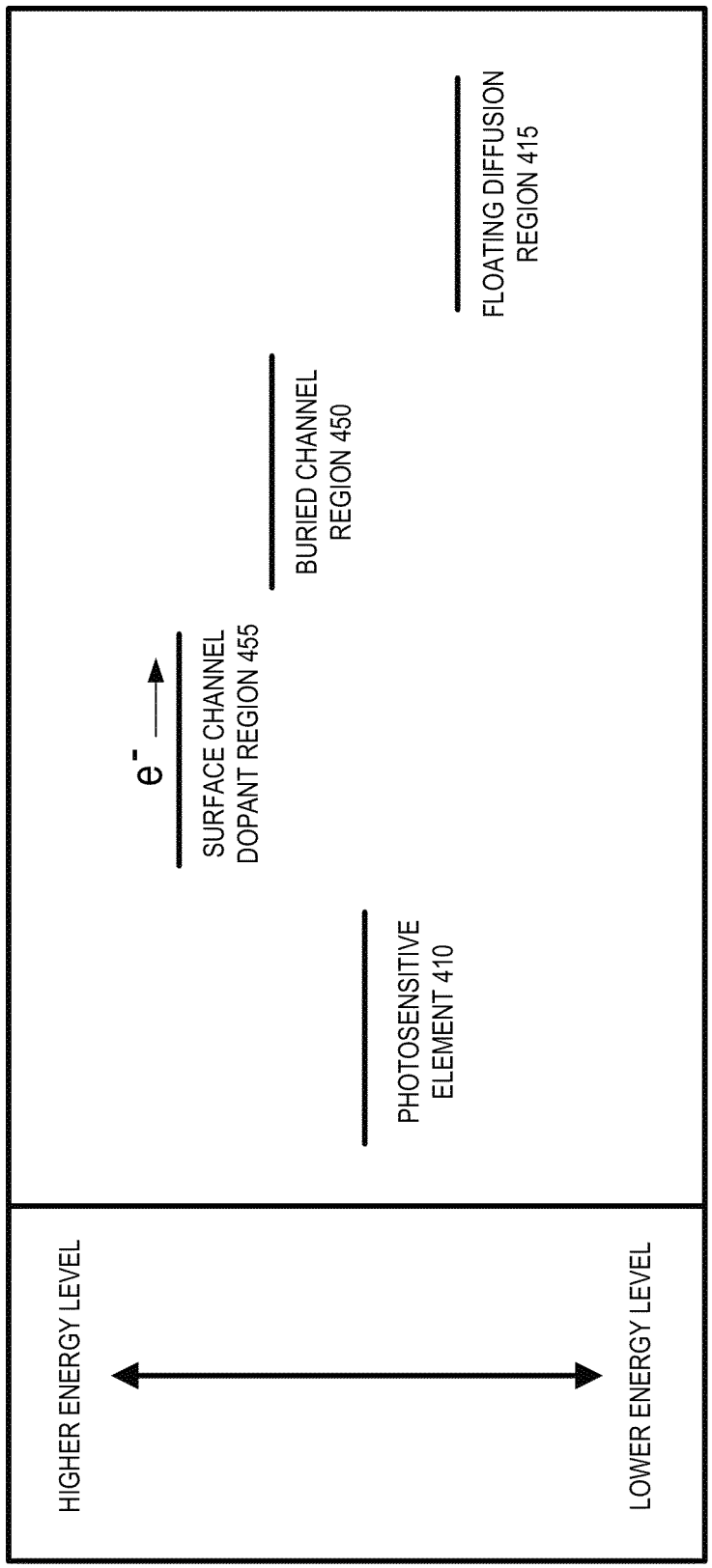
FIG. 5 is a chart illustrating a relationship between electrons and relative energy levels of structures, in accordance with an embodiment of the disclosure.

FIG. 5 is a chart illustrating a relationship between electrons and relative energy levels of structures, in accordance with an embodiment of the disclosure. FIG. 5 illustrates the relative energy levels that an electron may see in image pixel 400. Surface channel dopant region 455 has the highest energy level; buried channel dopant region 450 has the second highest energy level; photosensitive element 410 has the third highest energy level; floating diffusion region 415 has the lowest relative energy level on the chart. When electrons are in surface channel dopant region 455, the energy levels of the structures illustrated in FIG. 4A encourage electrons to flow towards floating diffusion region 415 whether transfer gate 425 is on or off. When the transfer gate is off, N type gate 440 combined with P type surface channel region 455 and N type buried channel region 450 causes electrons overflowing photosensitive element 410 to flow toward floating diffusion region 415. When the transfer gate is turned on, the relative energy levels in FIG. 5 are mostly maintained in spite of the surface channel device having a lower threshold voltage than the buried channel device. The result is that any dark current generated under transfer device 425 is likely to drift toward floating diffusion region 415. This feature prevents white pixels from forming and reduces image lag by discouraging electrons from being sent back to photosensitive element 410 after a transfer event.

Figure 6:
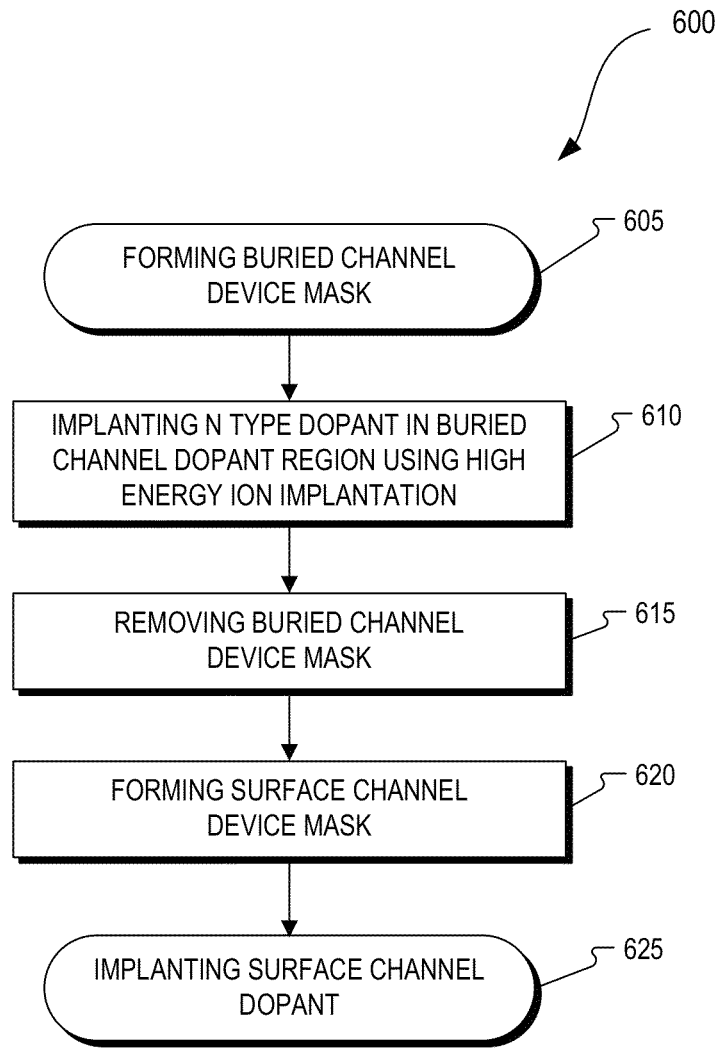
FIG. 6 is a flow chart illustrating a process for manufacturing a transfer device, in accordance with an embodiment of the disclosure.

FIG. 6 is a flow chart illustrating a process for manufacturing a transfer device, in accordance with an embodiment of the disclosure. Process 600 is one example of how to fabricate transfer device 425 of image pixel 400. The order in which some or all of the process blocks appear in each process should not be deemed limiting. Rather, one of ordinary skill in the art having the benefit of the present disclosure will understand that some of the process blocks may be executed in a variety of orders not illustrated, or even in parallel.

In process block 605, a buried channel device mask is formed on an existing structure. The buried channel device mask is patterned on the existing structure to isolate a region where the buried channel device will reside. An example of an existing structure may be a combination of P pinning layer 405, photosensitive element 410, floating diffusion region 415, substrate layer 420, gate 440, buried channel dopant region 450, and surface channel region 455. However, at process block 605, gate 440, buried channel dopant region 450, and surface channel region 455 may not yet contain the doping illustrated in FIG. 4A. For example, buried channel dopant region 450 and surface channel dopant region 455 would be lightly P doped in the "epi" layer at process block 605.

At process block 610, an N type dopant (e.g. Arsenic or Phosphorus) may be implanted in buried channel dopant region 450 using high energy ion implantation. The energy level to implant the Phosphorous may be 150 kiloelectron-volts (keV). The dopant implantation dose of the Phosphorous may be $1 \times 10^{12}$ cm$^{-2}$. In one embodiment, the depth of the N type dopant in buried channel region 450 is 10-30 nm. The high energy ion beam passes through gate 440 on its way to implanting buried channel dopant region 450. In process block 615, the buried channel device mask is removed. In process block 620, a surface channel device mask is formed. In process block 625, a surface channel dopant (P type dopant in the illustrated embodiment in FIG. 4A) is formed in surface channel region 455.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor pixel, comprising:
a photosensitive element disposed in a substrate layer for accumulating an image charge in response to light;
a floating diffusion ("FD") region disposed in the substrate layer to receive the image charge from the photosensitive element; and
a transfer device disposed between the photosensitive element and the FD region to selectively transfer the image charge from the photosensitive element to the FD region, the transfer device including:
a gate disposed between the photosensitive element and the floating diffusion region;
a buried channel dopant region disposed adjacent to the FD region and underneath the gate; and
a surface channel region disposed between the buried channel dopant region and the photosensitive element and disposed underneath the gate, wherein a ratio of a length of the buried channel dopant region and a length of the surface channel region is tuned to allow electrons from the photosensitive element to punch through to the buried channel dopant region when the photosensitive element approaches full capacity and the transfer device is off.

2. The image sensor pixel of claim 1 further comprising a doped well formed in the substrate layer, wherein the FD region is disposed in the doped well, the doped well extending below the FD region and extending between the FD region and the surface channel region.

3. The image sensor pixel of claim 1, wherein the buried channel dopant region is adjoining the FD region.

4. The image sensor of claim 1, wherein the gate and the buried channel dopant region form a buried channel device, and wherein the gate and the surface channel region form a surface channel device, wherein the surface channel device has a lower threshold voltage than the buried channel device.

5. The image sensor pixel of claim 1, wherein the photosensitive element, the FD region, the buried channel dopant region, and the gate are N type doped.

6. The image sensor pixel of claim 5, wherein the surface channel region is P type doped.

7. The image sensor pixel of claim 1, wherein the transfer device is configured to be turned off with a negative voltage.

8. The image sensor pixel of claim 1, wherein the surface channel region and the buried channel region are coupled in series between the photosensitive element and the FD region.

9. An imaging system comprising: an array of imaging pixels; and
readout circuitry coupled to the array of imaging pixels to readout image data from each of the image sensor pixels, wherein each imaging pixel in the array of imaging pixels includes:
a photosensitive element disposed in a substrate layer for accumulating an image charge in response to light;
a floating diffusion ("FD") region disposed in the substrate layer to receive the image charge from the photosensitive element; and
a transfer device disposed between the photosensitive element and the FD region to selectively transfer the image charge from the photosensitive element to the FD region, the transfer device including:
a gate disposed between the photosensitive element and the floating diffusion region;
a buried channel dopant region disposed adjacent to the FD region and underneath the gate; and
a surface channel region disposed between the buried channel dopant region and the photosensitive element and disposed underneath the gate, wherein a ratio of a length of the buried channel dopant region and a length of the surface channel region is tuned to allow electrons from the photosensitive element to punch through to the buried channel dopant region when the photosensitive element approaches full capacity and the transfer device is off.

10. The imaging system of claim 9 further comprising a doped well formed in the substrate layer, wherein the FD region is disposed in the doped well, the doped well extending below the FD region and extending between the FD region and the surface channel region.

11. The imaging system of claim 9, wherein the buried channel dopant region is adjoining the FD region.

12. The imaging system of claim 9, wherein the gate and the buried channel dopant region form a buried channel device, and wherein the gate and the surface region form a surface channel device, wherein the buried channel device has a higher threshold voltage than the surface channel device.

13. The imaging system of claim 9, wherein the photosensitive element, the FD region, the buried channel dopant region, and the gate are N type doped.

14. The imaging system of claim 13, wherein the surface channel region is P type doped.

15. The imaging system of claim 9, wherein the transfer device is configured to be turned off with a negative voltage.

16. The imaging system of claim 9, wherein the surface channel region and the buried channel region are coupled in series between the photosensitive element and the FD region.

17. An image sensor pixel, comprising:
a photosensitive element disposed in a substrate layer for accumulating an image charge in response to light;
a floating diffusion ("FD") region disposed in the substrate layer to receive the image charge from the photosensitive element; and
a transfer device disposed between the photosensitive element and the FD region to selectively transfer the image charge from the photosensitive element to the FD region, the transfer device including:
a gate disposed between the photosensitive element and the floating diffusion region;
a buried channel dopant region disposed adjacent to the FD region and underneath the gate, wherein the buried channel dopant region does not extend to the photosensitive element; and
a surface channel region disposed between the buried channel dopant region and the photosensitive element and disposed underneath the gate.

18. The image sensor pixel of claim 17, wherein the surface channel dopant region extends from the photosensitive element to the buried channel dopant region, and wherein the buried channel dopant region extends from the surface channel dopant region to the FD region.

* * * * *